United States Patent
Therrien et al.

(10) Patent No.: US 8,564,129 B2
(45) Date of Patent: Oct. 22, 2013

(54) LOW RESISTIVITY CONTACT

(75) Inventors: Robert Joseph Therrien, Cary, NC (US); Jason D. Reed, Chapel Hill, NC (US); Jaime A. Rumsey, Holly Springs, NC (US); Allen L. Gray, Holly Springs, NC (US)

(73) Assignee: Phononic Devices, Inc., Durham, NC (US)

( * ) Notice: Subject to any disclaimer, the term of this patent is extended or adjusted under 35 U.S.C. 154(b) by 0 days.

(21) Appl. No.: 13/565,960

(22) Filed: Aug. 3, 2012

(65) Prior Publication Data

US 2013/0069110 A1    Mar. 21, 2013

Related U.S. Application Data

(60) Provisional application No. 61/535,646, filed on Sep. 16, 2011.

(51) Int. Cl.
*H01L 23/48* (2006.01)
*H01L 29/43* (2006.01)

(52) U.S. Cl.
USPC ........... 257/741; 257/743; 257/744; 257/748; 257/467; 257/E23.163; 438/54; 438/602; 438/603

(58) Field of Classification Search
USPC .......... 257/467, E27.089, 741, 743, 744, 748, 257/E27.008, E23.154, E23.163; 438/54, 438/602, 603
See application file for complete search history.

(56) References Cited

U.S. PATENT DOCUMENTS

| | | | | |
|---|---|---|---|---|
| 4,350,990 | A | | 9/1982 | Lo |
| 4,722,087 | A | * | 1/1988 | Partin .......................... 372/44.01 |
| 2010/0229911 | A1 | * | 9/2010 | Leavitt et al. ................. 136/239 |
| 2011/0241153 | A1 | * | 10/2011 | McCann ....................... 257/467 |
| 2011/0266513 | A1 | * | 11/2011 | Williams et al. .................. 257/4 |
| 2012/0082848 | A1 | * | 4/2012 | Euliss et al. .................. 428/402 |

OTHER PUBLICATIONS

Gupta, P. et al., "Low Resistance Ohmic Contacts to Bi2Te3 Using Ni and Co Metallization," Journal of the Electrochemical Society, vol. 157, Apr. 27, 2010, pp. H666-H670.

Hermann, K. et al., "Low Ohmic Multilayer Contacts in Lead-Tin-Telluride Diode Lasers," Crystal Research and Technology, vol. 18, No. 8, 1983, pp. 1083-1089.

Taylor, P.J. et al., "IV-VI device arrays: Microfabrication and specific contact resistivity," Applied Physics Letters, vol. 85, No. 22, Nov. 29, 2004, pp. 5415-5417.

* cited by examiner

*Primary Examiner* — Kimberly Rizkallah
*Assistant Examiner* — Maria Ligai
(74) *Attorney, Agent, or Firm* — Withrow & Terranova, PLLC

(57) ABSTRACT

Embodiments of a low resistivity contact to a semiconductor structure are disclosed. In one embodiment, a semiconductor structure includes a semiconductor layer, a semiconductor contact layer having a low bandgap on a surface of the semiconductor layer, and an electrode on a surface of the semiconductor contact layer opposite the semiconductor layer. The bandgap of the semiconductor contact layer is in a range of and including 0 to 0.2 electron-volts (eV), more preferably in a range of and including 0 to 0.1 eV, even more preferably in a range of and including 0 to 0.05 eV. Preferably, the semiconductor layer is p-type. In one particular embodiment, the semiconductor contact layer and the electrode form an ohmic contact to the p-type semiconductor layer and, as a result of the low bandgap of the semiconductor contact layer, the ohmic contact has a resistivity that is less than $1 \times 10^{-6}$ ohms·cm$^2$.

25 Claims, 7 Drawing Sheets

LOW RESISTIVITY CONTACT

RELATED APPLICATIONS

This application claims the benefit of provisional patent application Ser. No. 61/535,646, filed Sep. 16, 2011, the disclosure of which is hereby incorporated herein by reference in its entirety.

FIELD OF THE DISCLOSURE

The present disclosure relates to a low resistivity electrical contact to a semiconductor structure.

BACKGROUND

Thermoelectric devices, namely thermoelectric power generators and coolers, have emerged as promising green technology. In general, thermoelectric devices offer the ability to convert waste-heat energy into electrical power or provide cooling from a solid state device. Applications of thermoelectric devices range from electronic thermal management, to solid state refrigeration, to power generation from waste heat sources. The figure-of-merit (ZT) of a thermoelectric material is a dimensionless unit that is used to compare the efficiencies of various materials. The figure-of-merit (ZT) is determined by three physical parameters, namely, thermopower $\alpha$ (also known as a Seebeck coefficient), electrical conductivity $\sigma$, thermal conductivity k, and absolute temperature T.

$$ZT = \frac{\alpha^2 \sigma}{k} T.$$

Maximum ZT in bulk thermoelectric materials is governed by the intrinsic properties of the material system. Most candidates require low thermal conductivity as the driving force for enhanced ZT because of the inverse relationship between the Seebeck coefficient and electrical conductivity. This interdependence and coupling between the Seebeck coefficient and the electrical conductivity have made it difficult to increase ZT>1, despite nearly five decades of research.

While the intrinsic properties of the thermoelectric material are the primary factor that drives the efficiency of a thermoelectric device, performance is also limited by both parasitic electrical and thermal resistances present in the thermoelectric device. The parasitic electrical resistance is primarily due to a barrier to current flow that forms when an external metal electrode is applied to the surface of the thermoelectric material. A barrier formed at the metal-thermoelectric interface (which is a metal-semiconductor interface) introduces resistance that is detrimental to the performance of the thermoelectric device.

The ideal ohmic contact to a semiconductor material follows the relationship:

$$\rho_c = \frac{\partial V}{\partial J}\bigg|_{V=0} \Omega \cdot cm^2,$$

where $\rho_c$ is a resistivity of the ohmic contact, J is current density, and V is voltage. To maintain a linear relationship between the current and voltage as illustrated in FIG. 1, it is necessary to avoid all non-linear behavior of the current with respect to the applied voltage as shown in FIG. 2. A barrier at the metal-semiconductor interface is formed due to the difference of work functions and electron affinities between the metal electrode and the semiconductor material. In the case of an n-type semiconductor material in intimate contact with a metal layer, the Schottky barrier height $\phi_b$ depicted in the band diagram of FIG. 3 can be calculated by the equation:

$$\phi_b = \phi_m - \chi, \text{ for an n-type semiconductor material}$$

where $\phi_m$ is a metal workfunction of the metal layer and $\chi$ is an electron affinity of the semiconductor material. As illustrated in FIG. 4, for a p-type semiconductor material, the barrier height $\phi_b$ is given by the difference in the valence band edge of the semiconductor material and the Fermi energy in the metal:

$$\phi_b = \frac{E_g}{q} + \chi - \phi_m,$$

for a p-type semiconductor
where $E_g$ is the semiconductor bandgap and q is the electronic charge. Conduction of carriers over or through the barrier determines the value of the resistivity $\rho_c$ of the ohmic contact. As such, reduction of the barrier height $\phi_b$ is the primary driver for obtaining low resistance contacts.

As such, there is a need for systems and methods for reducing the barrier height $\phi_b$ at an interface between a metal and a semiconductor material to provide a low resistivity electrical contact.

SUMMARY

Embodiments of a low resistivity contact to a semiconductor structure are disclosed. In one embodiment, a semiconductor structure includes a semiconductor layer, a semiconductor contact layer having a low bandgap on a surface of the semiconductor layer, and a metallic electrode on a surface of the semiconductor contact layer opposite the semiconductor layer. The bandgap of the semiconductor contact layer is in a range of and including 0 to 0.2 electron-volts (eV), more preferably in a range of and including 0 to 0.1 eV, even more preferably in a range of and including 0 to 0.05 eV. Preferably, the semiconductor layer is a p-type semiconductor layer. In one particular embodiment, the semiconductor contact layer and the metallic electrode form an ohmic contact to the p-type semiconductor layer and, as a result of the low bandgap of the semiconductor contact layer, the ohmic contact has a resistivity that is less than $1 \times 10^{-6}$ ohms·cm².

In one embodiment, the semiconductor contact layer is formed of a Group IV-VI semiconductor material having a low bandgap. In one particular embodiment, the semiconductor contact layer is formed of $Pb_xSn_{1-x}Se$, where $0 \leq x \leq 1$. In one embodiment, a mole fraction of Sn in the $Pb_xSn_{1-x}Se$ is in a range of and including 0.08 to 0.46, more preferably in a range of and including 0.18 to 0.37, and even more preferably in a range of and including 0.23 to 0.32. In another particular embodiment, the semiconductor contact layer is formed of $Pb_xSn_{1-x}Te$, where $0 \leq x \leq 1$. In one embodiment, a mole fraction of Sn in the $Pb_xSn_{1-x}Te$ is in a range of and including 0.21 to 0.95, more preferably in a range of and including 0.4 to 0.76, and even more preferably in a range of and including 0.49 to 0.67.

In one embodiment, the semiconductor layer includes one or more Group IV-VI semiconductor material layers, and the semiconductor contact layer is formed of a Group IV-VI semiconductor material having a low bandgap. In one particular embodiment, the semiconductor layer includes one or more layers of PbSe and $Pb_xSr_{1-x}Se$, where $0 \le x \le 1$, and the semiconductor contact layer is formed of $Pb_ySn_{1-y}Se$, where $0 \le y \le 1$. In one embodiment, a mole fraction of Sn in the $Pb_ySn_{1-y}Se$ is in a range of and including 0.08 to 0.46, more preferably in a range of and including 0.18 to 0.37, and even more preferably in a range of and including 0.23 to 0.32. In another particular embodiment, the semiconductor layer includes one or more layers of PbSe and $Pb_xSr_{1-x}Se$, where $0 \le y \le 1$, and the semiconductor contact layer is formed of $Pb_ySn_{1-y}Te$, where $0 \le y \le 1$. In one embodiment, a mole fraction of Sn in the $Pb_ySn_{1-y}Te$ is in a range of and including 0.21 to 0.95, more preferably in a range of and including 0.4 to 0.76, and even more preferably in a range of and including 0.49 to 0.67.

In another embodiment, a semiconductor structure includes a semiconductor layer, a first semiconductor contact layer having a low bandgap on a first surface of the semiconductor layer, a first metallic electrode on a surface of the first semiconductor contact layer opposite the semiconductor layer, a second semiconductor contact layer having a low bandgap on a second surface of the semiconductor layer opposite the first semiconductor contact layer, and a second metallic electrode on a surface of the second semiconductor contact layer opposite the semiconductor layer. The bandgap of each of the first and second semiconductor contact layers is in a range of and including 0 to 0.2 eV, more preferably in a range of and including 0 to 0.1 eV, even more preferably in a range of and including 0 to 0.05 eV. Preferably, the semiconductor layer is a p-type semiconductor layer. In one particular embodiment, the first and second semiconductor contact layers and the respective first and second metallic electrodes form corresponding ohmic contacts to the p-type semiconductor layer that, as a result of the low bandgap of the first semiconductor contact layer, each have a resistivity that is less than $1 \times 10^{-6}$ ohms·cm$^2$.

In one embodiment, the first and second semiconductor contact layers are each formed of a Group IV-VI semiconductor material having a low bandgap. In one particular embodiment, the first and second semiconductor contact layers are each formed of $Pb_xSn_{1-x}Se$, where $0 \le x \le 1$. In one embodiment, a mole fraction of Sn in the $Pb_xSn_{1-x}Se$ is in a range of and including 0.08 to 0.46, more preferably in a range of and including 0.18 to 0.37, and even more preferably in a range of and including 0.23 to 0.32. In another particular embodiment, the first and second semiconductor contact layers are each formed of $Pb_xSn_{1-x}Te$, where $0 \le x \le 1$. In one embodiment, a mole fraction of Sn in the $Pb_xSn_{1-x}Te$ is in a range of and including 0.21 to 0.95, more preferably in a range of and including 0.4 to 0.76, and even more preferably in a range of and including 0.49 to 0.67.

In one embodiment, the semiconductor layer includes one or more Group IV-VI semiconductor material layers, and the first and second semiconductor contact layers are each formed of a Group IV-VI semiconductor material having a low bandgap. In one particular embodiment, the semiconductor layer includes one or more layers of PbSe and $Pb_xSr_{1-x}Se$, where $0 \le x \le 1$, and the first and second semiconductor contact layers are each formed of $Pb_ySn_{1-y}Se$, where $0 \le y \le 1$. In one embodiment, a mole fraction of Sn in the $Pb_ySn_{1-y}Se$ is in a range of and including 0.08 to 0.46, more preferably in a range of and including 0.18 to 0.37, and even more preferably in a range of and including 0.23 to 0.32. In another particular embodiment, the semiconductor layer includes one or more layers of PbSe and $Pb_xSr_{1-x}Se$, where $0 \le x \le 1$, and the first and second semiconductor contact layers are each formed of $Pb_ySn_{1-y}Te$, where $0 \le y \le 1$. In one embodiment, a mole fraction of Sn in the $Pb_ySn_{1-y}Te$ is in a range of and including 0.21 to 0.95, more preferably in a range of and including 0.4 to 0.76, and even more preferably in a range of and including 0.49 to 0.67.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 6:
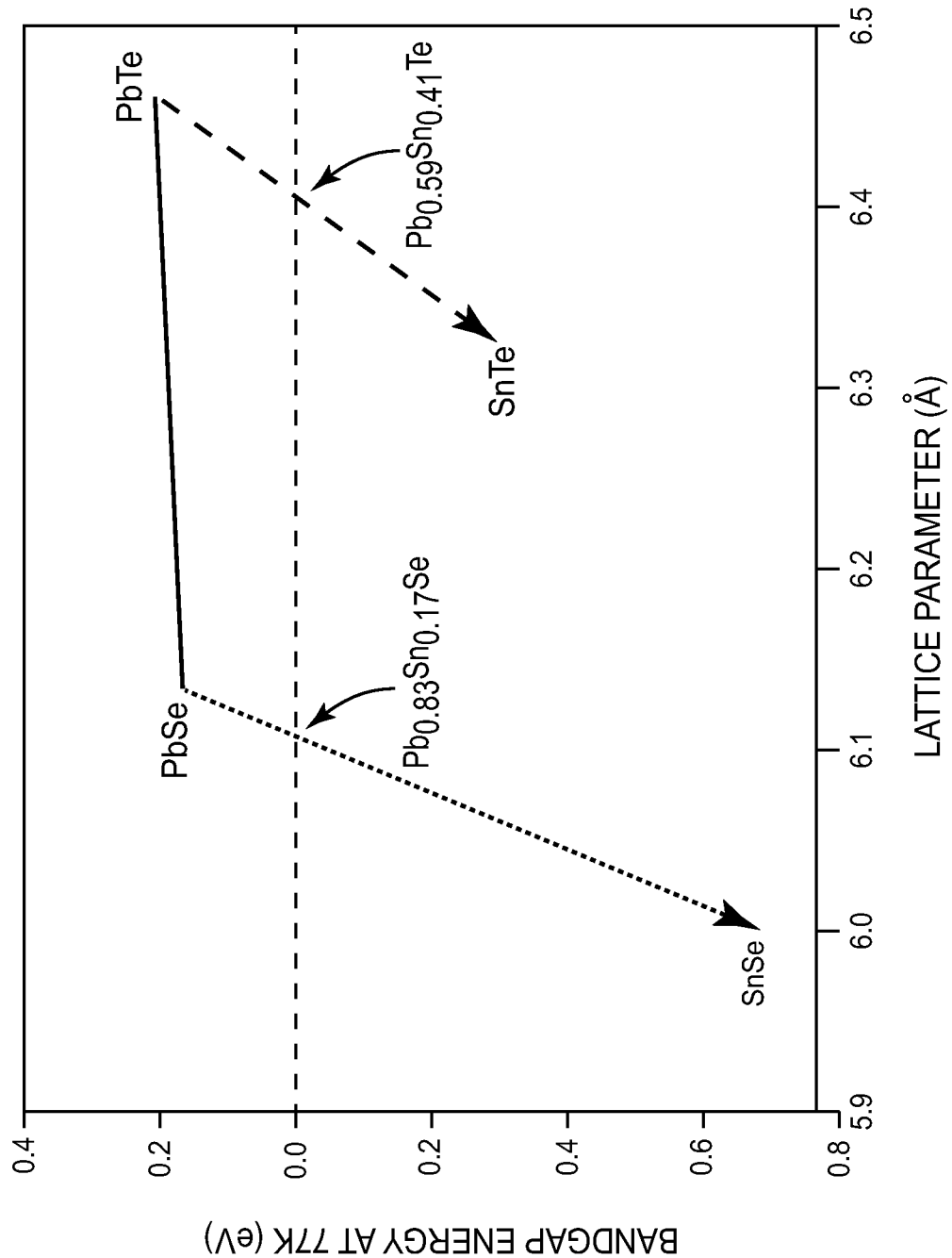
Figure 7:
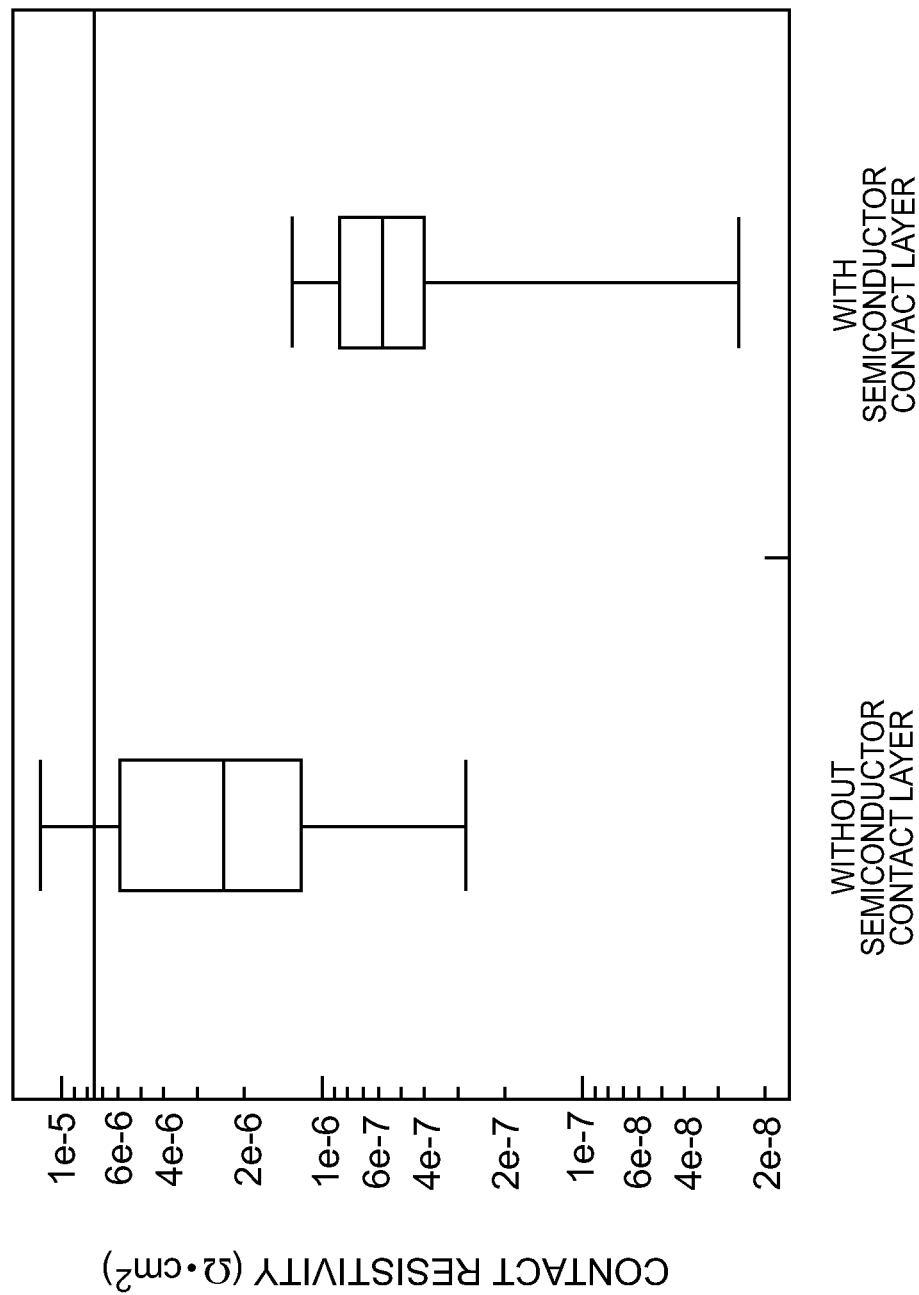
Figure 8:
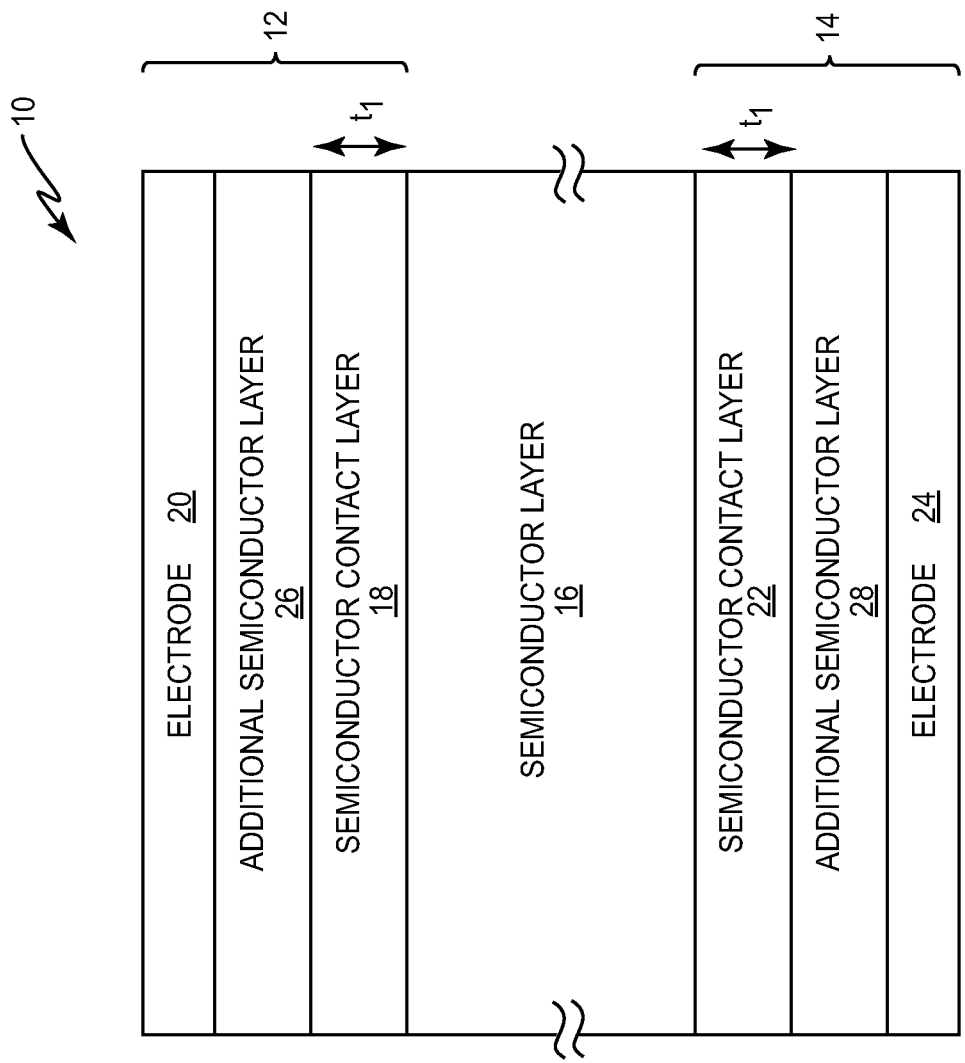

FIG. 6 is an energy band diagram of various Group IV-VI semiconductors at 77 degrees Kelvin (K) plotted as a function of lattice parameter that illustrates Group IV-VI semiconductors having bandgaps less than 0.2 electron-volts (eV), less than 0.1 eV, and less than 0.05 eV according to corresponding embodiments of the present disclosure;

FIG. 7 is a graph of contact resistivity data for examples of ohmic contacts fabricated with and without the semiconductor contact layers of the present disclosure; and FIG. 8 illustrates a semiconductor structure that includes a low resistivity ohmic contact according to another embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
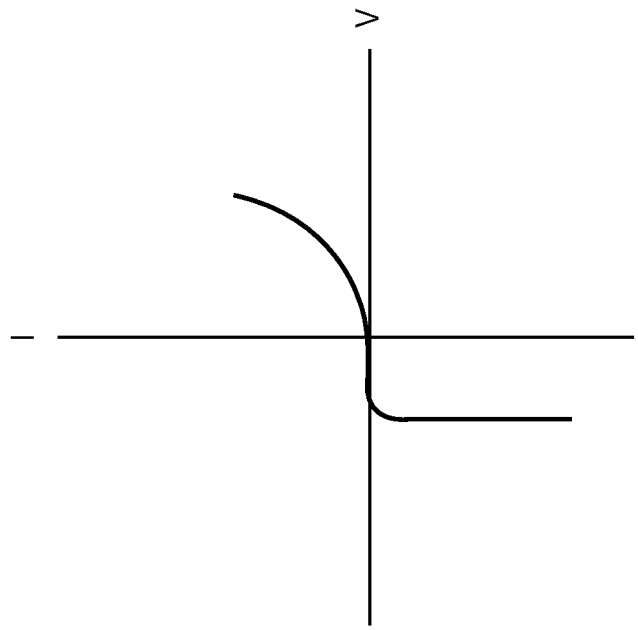
FIG. 2 is a current versus voltage graph illustrating rectifying performance in a metal-semiconductor contact.
Figure 1:
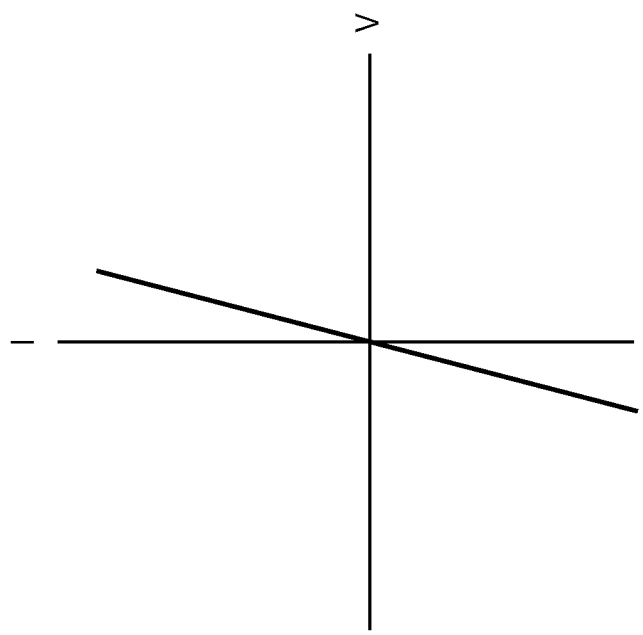
FIG. 1 is a current versus voltage graph illustrating ohmic performance in a metal-semiconductor contact.
Figure 3:
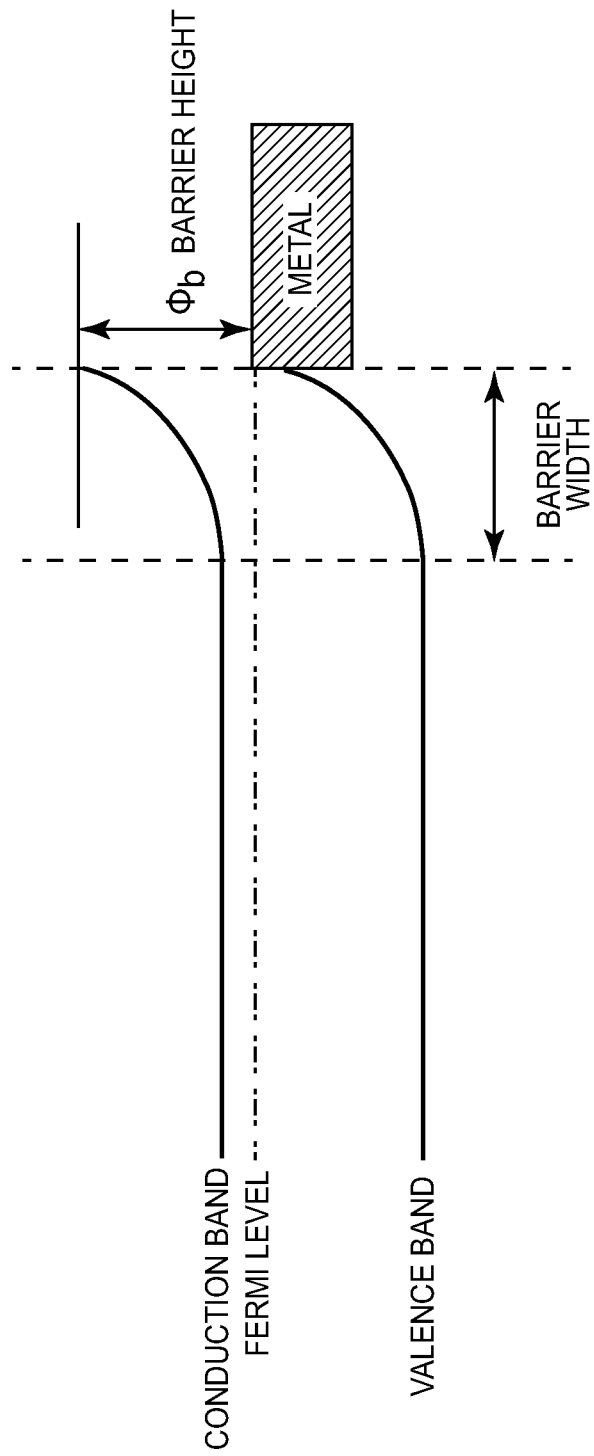
FIG. 3 is an n-type semiconductor to metal energy level diagram illustrating the barrier to current flow.
Figure 4:
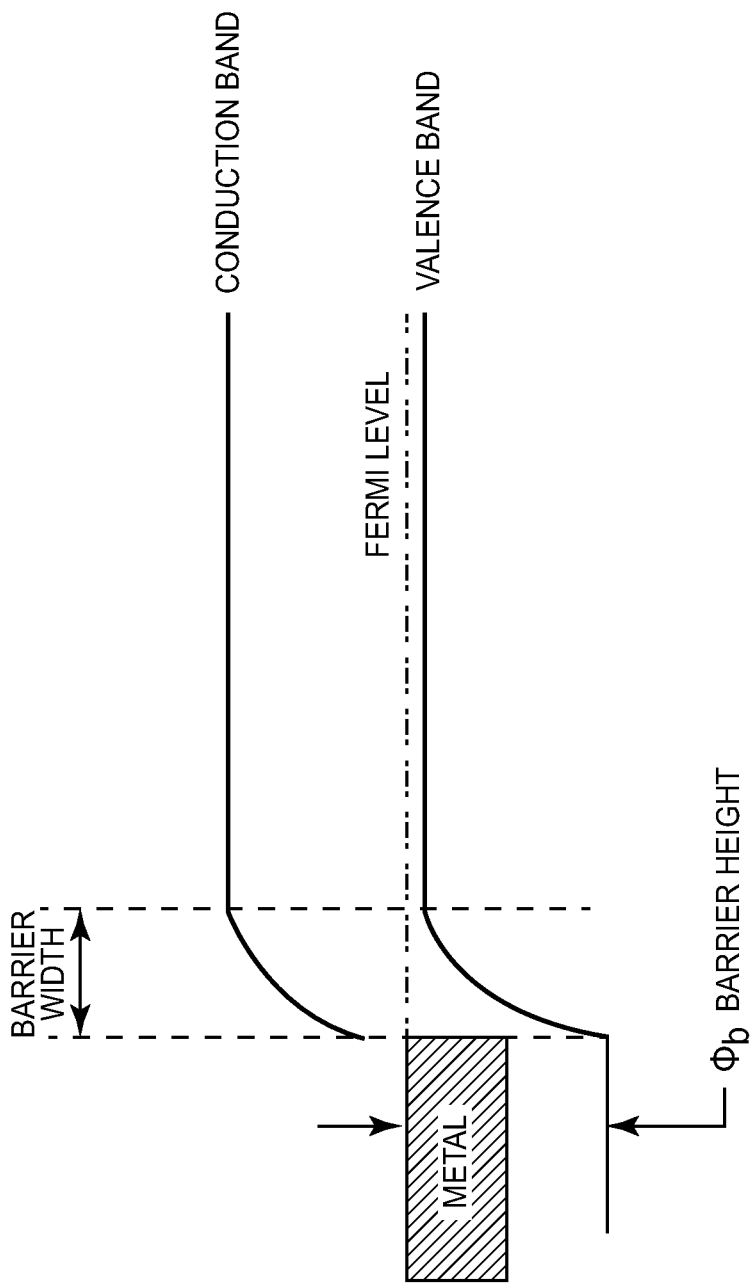
FIG. 4 is a p-type semiconductor to metal energy level diagram illustrating the barrier to current flow.
Figure 5:
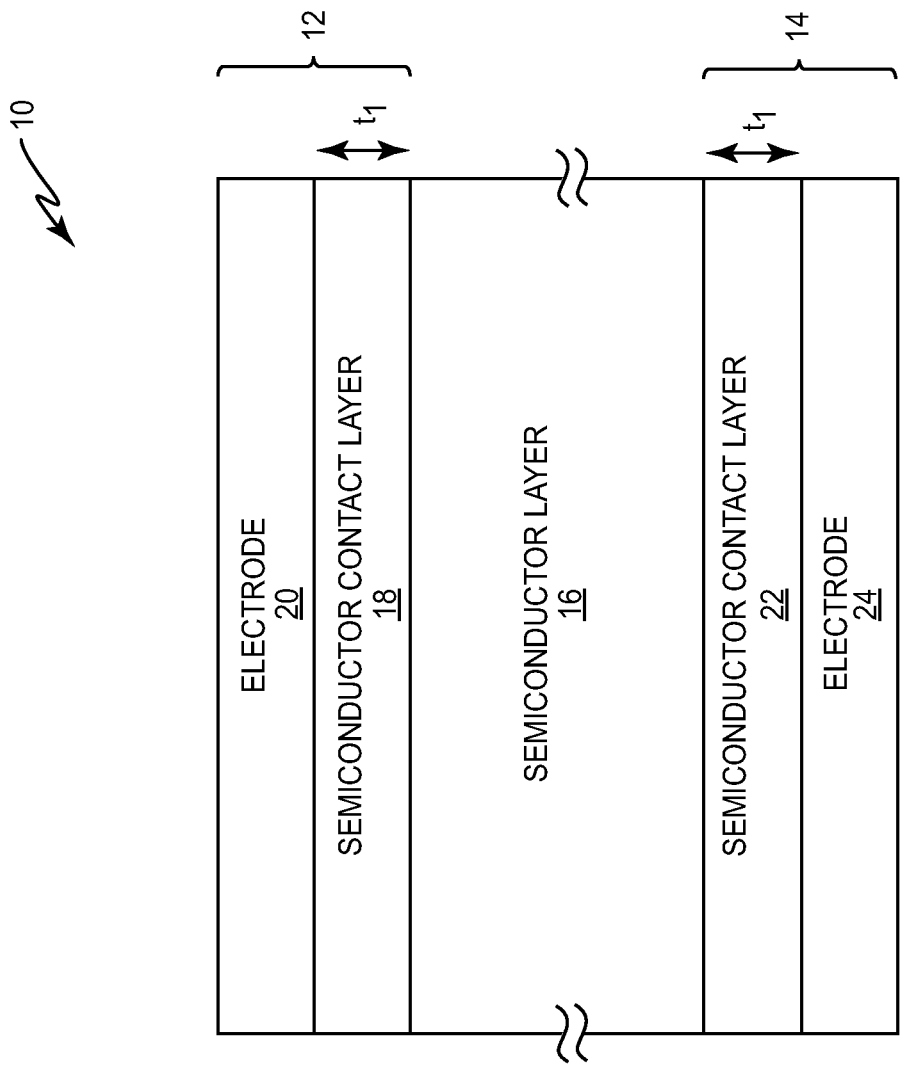
FIG. 5 illustrates a semiconductor structure that includes a low resistivity ohmic contact according to one embodiment of the present disclosure.

FIG. 5 illustrates one embodiment of a semiconductor structure 10 including low resistivity ohmic contacts 12 and 14 according to one embodiment of the present disclosure. As illustrated, the semiconductor structure 10 includes a semiconductor layer 16. While referred to herein as a "layer," the semiconductor layer 16 may be an epitaxial structure that includes one or more epitaxial layers, which may also be referred to herein as sub-layers of the semiconductor layer 16. While the semiconductor layer 16 may generally be any type of semiconductor layer, in one particular embodiment, the semiconductor layer 16 is a thermoelectric material. In one particular embodiment, the thermoelectric material is formed in a Group IIa and IV-VI materials system. In another embodiment, the thermoelectric material is a Lead Selenide (PbSe) based thermoelectric material. As an example, the thermoelectric material may include alternating layers of $Pb_{(1-x-y)}Sr_xSn_ySe$ $(0<x<1; 0<y<1)$ and $Pb_{(1-a-b)}Sr_aSn_bSe$ $(0<a<1; 0<b<1)$, where a bandgap of the $Pb_{(1-x-y)}Sr_xSn_ySe$ $(0<x<1; 0<y<1)$ is greater than a bandgap of the $Pb_{(1-a-b)}Sr_aSn_bSe$ $(0<a<1; 0<b<1)$.

The ohmic contact 12 includes a semiconductor contact layer 18 having a low bandgap on, and preferably directly on, a surface of the semiconductor layer 16 and a metallic electrode 20 on, and preferably directly on, a surface of the semiconductor contact layer 18 opposite the semiconductor layer 16. The bandgap of the semiconductor contact layer 18 is less than that of the semiconductor layer 16. In one embodiment, the bandgap of the semiconductor contact layer 18 is in a range of and including 0 to 0.2 electron-volts (eV). In another embodiment, the bandgap of the semiconductor contact layer 18 is in a range of and including 0 to 0.1 eV. In yet another embodiment, the bandgap of the semiconductor contact layer 18 is in a range of and including 0 to 0.05 eV. The semiconductor contact layer 18 preferably has a doping concentration greater than $1\times10^{17}$ dopants per $cm^3$ and a thickness ($t_1$) in a range of and including 0 to 2 micrometers (μm). In another embodiment, the semiconductor contact layer 18 has a doping concentration of greater than $8\times10^{18}$ dopants per $cm^3$, and the thickness ($t_1$) of the semiconductor contact layer 18 is in a range of and including 0 to 0.1 μm.

The metallic electrode 20 includes one or more layers of deposited metal such as, for example, Cobalt (Co), Palladium (Pd), Gold (Au), Silver (Ag), Nickel (Ni), Titanium (Ti), Platinum (Pt), Iridium (Ir), and/or related alloys. In one embodiment, the semiconductor layer 16 and the semiconductor contact layer 18 are n-type, and the metallic electrode 20 includes one or more layers of Co and/or Au. In another embodiment, the semiconductor layer 16 and the semiconductor contact layer 18 are p-type, and the metallic electrode 20 includes one or more layers of Pd and Au or one or more layers of Ir and Au. In one particular embodiment, the resistivity of the ohmic contact 12 is less than or equal to $1\times10^6$ $\Omega \cdot cm^2$.

Likewise, the ohmic contact 14 includes a semiconductor contact layer 22 having a low bandgap on a surface of the semiconductor layer 16 opposite the semiconductor contact layer 18 and a metallic electrode 24 on a surface of the semiconductor contact layer 22 opposite the semiconductor layer 16. The bandgap of the semiconductor contact layer 22 is less than that of the semiconductor layer 16. In one embodiment, the bandgap of the semiconductor contact layer 22 is in a range of and including 0 to 0.2 eV. In another embodiment, the bandgap of the semiconductor contact layer 22 is in a range of and including 0 to 0.1 eV. In yet another embodiment, the bandgap of the semiconductor contact layer 22 is in a range of and including 0 to 0.05 eV. The semiconductor contact layer 22 preferably has a doping concentration greater than $1\times10^{17}$ dopants per $cm^3$ and a thickness ($t_1$) in a range of and including 0 to 2 μm. In another embodiment, the semiconductor contact layer 22 has a doping concentration of greater than $8\times10^{18}$ dopants per $cm^3$, and the thickness ($t_1$) of the semiconductor contact layer 22 is in a range of and including 0 to 0.1 μm.

The metallic electrode 24 includes one or more layers of deposited metal such as, for example, Co, Pd, Au, Ag, Ni, Ti, Pt, Ir, and/or related alloys. In one embodiment, the semiconductor layer 16 and the semiconductor contact layer 22 are n-type, and the metallic electrode 24 includes one or more layers of Co and/or Au. In another embodiment, the semiconductor layer 16 and the semiconductor contact layer 22 are p-type, and the metallic electrode 24 includes one or more layers of Pd and Au or one or more layers of Ir and Au. In one particular embodiment, the resistivity of the ohmic contact 14 is less than or equal to $1\times10^6$ $\Omega \cdot cm^2$.

In one preferred embodiment, the semiconductor layer 16 and the semiconductor contact layers 18 and 22 are p-type. Further, as discussed above, the bandgap of the semiconductor contact layers 18 and 22 is preferably in a range of and including 0 to 0.2 eV, more preferably in a range of and including 0 to 0.1 eV, even more preferably in a range of and including 0 to 0.05 eV, and even more preferably approximately zero. By minimizing the bandgap of the semiconductor contact layers 18 and 22, the resistivity of the ohmic contacts 12 and 14 is substantially reduced as compared to conventional ohmic contacts, particularly those to p-type semiconductors. More specifically, for a p-type semiconductor, a barrier height ($\phi_b$) of a barrier at an interface between a metal and the p-type semiconductor is defined as:

$$\phi_b = \frac{E_g}{q} + \chi - \phi_m,$$

where $E_g$ is a bandgap of the p-type semiconductor, $\chi$ is an electron affinity of the p-type semiconductor, and $\phi_m$ is a work function of the metal. By definition, an ohmic contact is formed when the barrier height ($\phi_b$) has a zero or negative value. Most metals have a work function on the order of 5 volts (V), and electron affinities of most semiconductors are on the order of 4 V. As such, an ohmic contact to a p-type semiconductor is, in general, obtained when the bandgap of the p-type semiconductor is less than or equal to 1 eV. Further reduction or minimization of the bandgap of the p-type semiconductor is desired to obtain a low resistivity ohmic contact.

In one embodiment, the semiconductor contact layers 18 and 22 are formed of a Group IV-VI semiconductor material having a low bandgap. In one preferred embodiment, the semiconductor contact layers 18 and 22 are formed of $Pb_xSn_{1-x}Se$, where $0 \leq x \leq 1$ in fixed for varying concentration across the thicknesses ($t_1$) of the semiconductor contact layers 18 and 22. Preferably, the semiconductor contact layers 18 and 22 and the semiconductor layer 16 are p-type. In order to reduce the resistivity of the ohmic contacts 12 and 14, the bandgap of $Pb_xSn_{1-x}Se$ can be tailored to be ultra low by varying the Sn content, as discussed below in detail. By adjusting the Tin (Sn) content in the $Pb_xSn_{1-x}Se$, the bandgap of the semiconductor contact layers 18 and 22 can be adjusted to be in the range of 0 to 0.2 eV, more preferably in the range of 0 to 0.1 eV, and even more preferably in the range of 0 to 0.1 eV, and even more preferably approximately 0. In one embodiment, a mole fraction of Sn in the $Pb_xSn_{1-x}Se$ is in a range of and including 0.08 to 0.46, more preferably in a range of and including 0.18 to 0.37, and even more preferably in a range of and including 0.23 to 0.32. In this embodiment, the semiconductor layer 16 may be, for example, a thermoelectric material formed in a Group IIa and IV-VI materials system, a PbSe-based thermoelectric material, or the like. In one particular embodiment, the semiconductor layer 16 includes alternating barrier and well layers, where each barrier layer includes one or more layers of $Pb_{(1-x-y)}Sr_xSn_ySe$ (0<x<1; 0<y<1) material and each well layer includes one or more layers of $Pb_{(1-a-b)}Sr_aSn_bSe$ (0<a<1; 0<b<1) material and where a bandgap of the $Pb_{(1-x-y)}Sr_xSn_ySe$ (0<x<1; 0<y<1) material is greater than a bandgap of the $Pb_{(1-a-b)}Sr_aSn_bSe$ (0<a<1; 0<b<1) material.

In another preferred embodiment, the semiconductor contact layers 18 and 22 are formed of $Pb_xSn_{1-x}Te$, where $0 \leq x \leq 1$ in fixed for varying concentration across the thicknesses ($t_1$) of the semiconductor contact layers 18 and 22. Preferably, the semiconductor contact layers 18 and 22 and the semiconductor layer 16 are p-type. In order reduce the resistivity of the ohmic contacts 12 and 14, the bandgap of $Pb_xSn_{1-x}Te$ can be tailored to be ultra low by varying the Sn content, as discussed below in detail. By adjusting the Sn content in the $Pb_xSn_{1-x}Te$, the bandgap of the semiconductor contact layers 18 and 22 can be adjusted to be in the range of 0 to 0.2 eV, more preferably in the range of 0 to 0.1 eV, and even more preferably in the range of 0 to 0.1 eV, and even more preferably approximately 0. In one embodiment, a mole fraction of Sn in the $Pb_xSn_{1-x}Te$ is in a range of and including 0.21 to 0.95, more preferably in a range of and including 0.4 to 0.76, and even more preferably in a range of and including 0.49 to 0.67. In this embodiment, the semiconductor layer 16 may be, for example, a thermoelectric material formed in a Group IIa and IV-VI materials system, a PbSe-based thermoelectric material, or the like. In one particular embodiment, the semiconductor layer 16 includes alternating barrier and well layers, where each barrier layer includes one or more layers of $Pb_{(1-x-y)}Sr_xSn_ySe$ (0<x<1; 0<y<1) material and each well layer includes one or more layers of $Pb_{(1-a-b)}Sr_aSn_bSe$ (0<a<1; 0<b<1) material and where a bandgap of the $Pb_{(1-x-y)}Sr_xSn_ySe$ (0<x<1; 0<y<1) material is greater than a bandgap of the $Pb_{(1-a-b)}Sr_aSn_bSe$ (0<a<1; 0<b<1) material.

Before proceeding, it should be noted that the semiconductor structure 10 can be fabricated using any suitable fabrication process. In general, fabrication of the semiconductor structure 10 includes providing the semiconductor layer 16 by, for example, growing the semiconductor layer 16 on a sacrificial substrate (e.g., a silicon or sapphire substrate). The semiconductor contact layer 18 is then formed or otherwise provided on the surface of the semiconductor layer 16. For example, the semiconductor contact layer 18 may be grown using a suitable epitaxial growth process. The metallic electrode 20 is then formed or otherwise provided on the surface of the semiconductor contact layer 18 opposite the semiconductor layer 16. The semiconductor layer 16 may then be removed from the sacrificial substrate. Then, the semiconductor contact layer 22 is formed or otherwise provided on the surface of the semiconductor layer 16 opposite the semiconductor contact layer 18. For example, the semiconductor contact layer 22 may be grown using a suitable epitaxial growth process. The metallic electrode 24 is then formed or otherwise provided on the surface of the semiconductor contact layer 22 opposite the semiconductor layer 16.

FIG. 6 is a bandgap versus lattice parameter diagram showing alloy compositions for PbSnSe and PbSnTe for varying bandgaps at 77 degrees Kelvin (K). Here, the lattice parameter is unit cell size in Angstroms (Å). As illustrated, the bandgap of $Pb_xSn_{1-x}Se$ can be tailored by varying the Sn content. The bandgap of $Pb_xSn_{1-x}Se$ is approximately zero when the mole fraction of Sn is 0.17. In particular, the bandgap of $Pb_xSn_{1-x}Se$ versus mole fraction of Sn at 77 degrees K is shown in Table 1 below.

TABLE 1

| Mole Fraction of Sn | Eg (eV) PbSnSe |
|---|---|
| 0 | 0.1688 |
| 0.01 | 0.1586 |
| 0.02 | 0.1484 |
| 0.03 | 0.1382 |
| 0.04 | 0.1280 |
| 0.05 | 0.1177 |
| 0.06 | 0.1075 |
| 0.07 | 0.0973 |
| 0.08 | 0.0871 |
| 0.09 | 0.0769 |
| 0.1 | 0.0667 |
| 0.11 | 0.0565 |
| 0.12 | 0.0463 |
| 0.13 | 0.0361 |
| 0.14 | 0.0259 |
| 0.15 | 0.0156 |
| 0.16 | 0.0054 |
| 0.17 | 0.0048 |
| 0.18 | 0.0150 |
| 0.19 | 0.0252 |
| 0.2 | 0.0354 |
| 0.21 | 0.0456 |
| 0.22 | 0.0558 |
| 0.23 | 0.0660 |
| 0.24 | 0.0762 |
| 0.25 | 0.0865 |
| 0.26 | 0.0967 |
| 0.27 | 0.1069 |
| 0.28 | 0.1171 |

TABLE 1-continued

| Mole Fraction of Sn | Eg (eV) PbSnSe |
|---|---|
| 0.29 | 0.1273 |
| 0.3 | 0.1375 |
| 0.31 | 0.1477 |
| 0.32 | 0.1579 |
| 0.33 | 0.1681 |
| 0.34 | 0.1783 |
| 0.35 | 0.1886 |
| 0.36 | 0.1988 |
| 0.37 | 0.2090 |
| 0.38 | 0.2192 |
| 0.39 | 0.2294 |
| 0.4 | 0.2396 |

From Table 1, it can be seen that at 77 degrees K, the bandgap of $Pb_xSn_{1-x}Se$ is in the range of and including 0 to 0.2 eV when the mole fraction of Sn is in the range of and including 0 to 0.36, in the range of and including 0 to 0.1 eV when the mole fraction of Sn is in the range of and including 0.07 to 0.26, and in the range of and including 0 to 0.05 eV when the mole fraction of Sn is in the range of and including 0.12 to 0.21.

Notably, the bandgap of $Pb_xSn_{1-x}Se$ versus Sn content varies depending on temperature. For instance, Table 2 below gives the bandgap of $Pb_xSn_{1-x}Se$ versus mole fraction of Sn at 300 degrees K.

TABLE 2

| Mole Fraction of Sn | Eg (eV) PbSnSe |
|---|---|
| 0 | 0.2781 |
| 0.01 | 0.2679 |
| 0.02 | 0.2577 |
| 0.03 | 0.2475 |
| 0.04 | 0.2373 |
| 0.05 | 0.2271 |
| 0.06 | 0.2168 |
| 0.07 | 0.2066 |
| 0.08 | 0.1964 |
| 0.09 | 0.1862 |
| 0.1 | 0.1760 |
| 0.11 | 0.1658 |
| 0.12 | 0.1556 |
| 0.13 | 0.1454 |
| 0.14 | 0.1352 |
| 0.15 | 0.1250 |
| 0.16 | 0.1147 |
| 0.17 | 0.1045 |
| 0.18 | 0.0943 |
| 0.19 | 0.0841 |
| 0.2 | 0.0739 |
| 0.21 | 0.0637 |
| 0.22 | 0.0535 |
| 0.23 | 0.0433 |
| 0.24 | 0.0331 |
| 0.25 | 0.0229 |
| 0.26 | 0.0126 |
| 0.27 | 0.0024 |
| 0.28 | 0.0078 |
| 0.29 | 0.0180 |
| 0.3 | 0.0282 |
| 0.31 | 0.0384 |
| 0.32 | 0.0486 |
| 0.33 | 0.0588 |
| 0.34 | 0.0690 |
| 0.35 | 0.0792 |
| 0.36 | 0.0895 |
| 0.37 | 0.0997 |
| 0.38 | 0.1099 |
| 0.39 | 0.1201 |
| 0.4 | 0.1303 |
| 0.41 | 0.1405 |
| 0.42 | 0.1507 |

TABLE 2-continued

| Mole Fraction of Sn | Eg (eV) PbSnSe |
|---|---|
| 0.43 | 0.1609 |
| 0.44 | 0.1711 |
| 0.45 | 0.1813 |
| 0.46 | 0.1916 |
| 0.47 | 0.2018 |
| 0.48 | 0.2120 |

From Table 2, it can be seen that at 300 degrees K, the bandgap of $Pb_xSn_{1-x}Se$ is in the range of and including 0 to 0.2 eV when the mole fraction of Sn is in the range of and including 0.08 to 0.46, in the range of and including 0 to 0.1 eV when the mole fraction of Sn is in the range of and including 0.18 to 0.37, and in the range of and including 0 to 0.05 eV when the mole fraction of Sn is in the range of and including 0.23 to 0.32.

Likewise, FIG. 6 illustrates that the bandgap of $Pb_xSn_{1-x}Te$ can be tailored by varying the Sn content. For 77 degrees K, the bandgap of $Pb_xSn_{1-x}Te$ is approximately zero when the mole fraction of Sn is 0.41. In particular, the bandgap of $Pb_xSn_{1-x}Te$ versus mole fraction of Sn at 77 degrees K is shown in Table 3 below.

TABLE 3

| Mole Fraction of Sn | Eg (eV) PbSnTe |
|---|---|
| 0 | 0.2190 |
| 0.01 | 0.2137 |
| 0.02 | 0.2083 |
| 0.03 | 0.2030 |
| 0.04 | 0.1976 |
| 0.05 | 0.1923 |
| 0.06 | 0.1869 |
| 0.07 | 0.1816 |
| 0.08 | 0.1762 |
| 0.09 | 0.1709 |
| 0.1 | 0.1655 |
| 0.11 | 0.1602 |
| 0.12 | 0.1548 |
| 0.13 | 0.1495 |
| 0.14 | 0.1441 |
| 0.15 | 0.1388 |
| 0.16 | 0.1334 |
| 0.17 | 0.1281 |
| 0.18 | 0.1227 |
| 0.19 | 0.1174 |
| 0.2 | 0.1120 |
| 0.21 | 0.1067 |
| 0.22 | 0.1013 |
| 0.23 | 0.0960 |
| 0.24 | 0.0906 |
| 0.25 | 0.0853 |
| 0.26 | 0.0799 |
| 0.27 | 0.0746 |
| 0.28 | 0.0692 |
| 0.29 | 0.0639 |
| 0.3 | 0.0585 |
| 0.31 | 0.0531 |
| 0.32 | 0.0478 |
| 0.33 | 0.0425 |
| 0.34 | 0.0371 |
| 0.35 | 0.0318 |
| 0.36 | 0.0264 |
| 0.37 | 0.0211 |
| 0.38 | 0.0157 |
| 0.39 | 0.0103 |
| 0.4 | 0.0050 |
| 0.41 | 0.0004 |
| 0.42 | 0.0057 |
| 0.43 | 0.0111 |
| 0.44 | 0.0164 |
| 0.45 | 0.0218 |
| 0.46 | 0.0271 |

TABLE 3-continued

| Mole Fraction of Sn | Eg (eV) PbSnTe |
|---|---|
| 0.47 | 0.0325 |
| 0.48 | 0.0378 |
| 0.49 | 0.0432 |
| 0.5 | 0.0485 |
| 0.51 | 0.0539 |
| 0.52 | 0.0592 |
| 0.53 | 0.0646 |
| 0.54 | 0.0699 |
| 0.55 | 0.0753 |
| 0.56 | 0.0806 |
| 0.57 | 0.0860 |
| 0.58 | 0.0913 |
| 0.59 | 0.0967 |
| 0.6 | 0.1020 |
| 0.61 | 0.1074 |
| 0.62 | 0.1127 |
| 0.63 | 0.1181 |
| 0.64 | 0.1234 |
| 0.65 | 0.1288 |
| 0.66 | 0.1341 |
| 0.67 | 0.1395 |
| 0.68 | 0.1448 |
| 0.69 | 0.1502 |
| 0.7 | 0.1555 |
| 0.71 | 0.1609 |
| 0.72 | 0.1662 |
| 0.73 | 0.1716 |
| 0.74 | 0.1769 |
| 0.75 | 0.1823 |
| 0.76 | 0.1876 |
| 0.77 | 0.1930 |
| 0.78 | 0.1983 |
| 0.79 | 0.2037 |
| 0.8 | 0.2090 |

From Table 3, it can be seen that at 77 degrees K, the bandgap of $Pb_xSn_{1-x}Te$ is in the range of and including 0 to 0.2 eV when the mole fraction of Sn is in the range of and including 0.04 to 0.78, in the range of and including 0 to 0.1 eV when the mole fraction of Sn is in the range of and including 0.23 to 0.59, and in the range of and including 0 to 0.05 eV when the mole fraction of Sn is in the range of and including 0.32 to 0.5.

The bandgap of $Pb_xSn_{1-x}Te$ versus mole fraction of Sn at 300 degrees K is shown in Table 4 below.

TABLE 4

| Mole Fraction of Sn | Eg (eV) PbSnTe |
|---|---|
| 0.00 | 0.3116 |
| 0.01 | 0.3062 |
| 0.02 | 0.3009 |
| 0.03 | 0.2955 |
| 0.04 | 0.2902 |
| 0.05 | 0.2848 |
| 0.06 | 0.2795 |
| 0.07 | 0.2741 |
| 0.08 | 0.2688 |
| 0.09 | 0.2634 |
| 0.10 | 0.2581 |
| 0.11 | 0.2527 |
| 0.12 | 0.2474 |
| 0.13 | 0.2420 |
| 0.14 | 0.2367 |
| 0.15 | 0.2313 |
| 0.16 | 0.2260 |
| 0.17 | 0.2206 |
| 0.18 | 0.2153 |
| 0.19 | 0.2099 |
| 0.20 | 0.2046 |
| 0.21 | 0.1992 |
| 0.22 | 0.1939 |
| 0.23 | 0.1885 |
| 0.24 | 0.1832 |

TABLE 4-continued

| Mole Fraction of Sn | Eg (eV) PbSnTe |
|---|---|
| 0.25 | 0.1778 |
| 0.26 | 0.1725 |
| 0.27 | 0.1671 |
| 0.28 | 0.1618 |
| 0.29 | 0.1564 |
| 0.30 | 0.1511 |
| 0.31 | 0.1457 |
| 0.32 | 0.1404 |
| 0.33 | 0.1350 |
| 0.34 | 0.1297 |
| 0.35 | 0.1243 |
| 0.36 | 0.1190 |
| 0.37 | 0.1136 |
| 0.38 | 0.1083 |
| 0.39 | 0.1029 |
| 0.40 | 0.0976 |
| 0.41 | 0.0922 |
| 0.42 | 0.0869 |
| 0.43 | 0.0815 |
| 0.44 | 0.0762 |
| 0.45 | 0.0708 |
| 0.46 | 0.0655 |
| 0.47 | 0.0601 |
| 0.48 | 0.0548 |
| 0.49 | 0.0494 |
| 0.50 | 0.0441 |
| 0.51 | 0.0387 |
| 0.52 | 0.0334 |
| 0.53 | 0.0280 |
| 0.54 | 0.0227 |
| 0.55 | 0.0173 |
| 0.56 | 0.0120 |
| 0.57 | 0.0066 |
| 0.58 | 0.0013 |
| 0.59 | 0.0041 |
| 0.60 | 0.0094 |
| 0.61 | 0.0148 |
| 0.62 | 0.0201 |
| 0.63 | 0.0255 |
| 0.64 | 0.0308 |
| 0.65 | 0.0362 |
| 0.66 | 0.0415 |
| 0.67 | 0.0469 |
| 0.68 | 0.0522 |
| 0.69 | 0.0576 |
| 0.70 | 0.0629 |
| 0.71 | 0.0683 |
| 0.72 | 0.0736 |
| 0.73 | 0.0790 |
| 0.74 | 0.0843 |
| 0.75 | 0.0897 |
| 0.76 | 0.0950 |
| 0.77 | 0.1004 |
| 0.78 | 0.1057 |
| 0.79 | 0.1111 |
| 0.80 | 0.1164 |
| 0.81 | 0.1218 |
| 0.82 | 0.1271 |
| 0.83 | 0.1325 |
| 0.84 | 0.1378 |
| 0.85 | 0.1432 |
| 0.86 | 0.1485 |
| 0.87 | 0.1539 |
| 0.88 | 0.1592 |
| 0.89 | 0.1646 |
| 0.90 | 0.1699 |
| 0.91 | 0.1753 |
| 0.92 | 0.1806 |
| 0.93 | 0.1860 |
| 0.94 | 0.1913 |
| 0.95 | 0.1967 |
| 0.96 | 0.2020 |
| 0.97 | 0.2074 |
| 0.98 | 0.2127 |
| 0.99 | 0.2181 |
| 1.00 | 0.2234 |

From Table 4, it can be seen that at 300 degrees K, the bandgap of $Pb_xSn_{1-x}Te$ is in the range of and including 0 to 0.2 eV when the mole fraction of Sn is in the range of 0.21 to 0.95, in the range of and including 0 to 0.1 eV when the mole fraction of Sn is in the range of 0.4 to 0.76, and in the range of and including 0 to 0.05 eV when the mole fraction of Sn is in the range of 0.49 to 0.67.

FIG. 7 is a graph of contact resistivity of an ohmic contact with and without the semiconductor contact layer 18, 22 according to one particular embodiment of the present disclosure. As illustrated, in general, the contact resistivity with the semiconductor contact layer 18, 22 is substantially lower than that of the same ohmic contact without the semiconductor contact layer 18, 22.

FIG. 8 illustrates the semiconductor structure 10 according to another embodiment of the present disclosure. In this embodiment, the ohmic contact 12 further includes an additional semiconductor layer 26 between the semiconductor contact layer 18 and the metallic electrode 20. Likewise, the ohmic contact 14 includes an additional semiconductor layer 28 between the semiconductor contact layer 22 and the metallic electrode 24. In general, the additional semiconductor layers 26 and 28 have bandgaps that are larger than that of the semiconductor contact layers 18 and 22 and are heavily doped (i.e., carrier concentrations $\geq 1 \times 10^{18}$ cm$^{-3}$). In one particular embodiment, the additional semiconductor layers 26 and 28 are formed of PbSe.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor structure comprising:
  a semiconductor layer;
  a semiconductor contact layer on a surface of the semiconductor layer, the semiconductor contact layer having a bandgap that is in a range of and including 0 to 0.1 electron-volts; and
  a metallic electrode on a surface of the semiconductor contact layer opposite the semiconductor layer.

2. The semiconductor structure of claim 1 wherein the semiconductor layer is a p-type semiconductor layer.

3. The semiconductor structure of claim 2 wherein the semiconductor contact layer and the metallic electrode form an ohmic contact having a resistivity that is less than $1 \times 10^{-6}$ ohms·cm$^2$.

4. The semiconductor structure of claim 2 wherein the bandgap of the semiconductor contact layer is in a range of and including 0 to 0.05 electron-volts.

5. The semiconductor structure of claim 1 comprising an additional layer between the semiconductor contact layer and the metallic electrode.

6. The semiconductor structure of claim 1 further comprising:
  a second semiconductor contact layer on a second surface of the semiconductor layer opposite the semiconductor contact layer, the second semiconductor contact layer having a bandgap that is in the range of and including 0 to 0.2 electron-volts; and
  a second metallic electrode on a surface of the second semiconductor contact layer opposite the semiconductor layer.

7. The semiconductor structure of claim 1 wherein the metallic electrode is directly on the surface of the semiconductor contact layer opposite the semiconductor layer.

8. A semiconductor structure comprising:
  a semiconductor layer;
  a p-type semiconductor contact layer on a surface of the semiconductor layer, the p-type semiconductor contact layer being formed of $Pb_xSn_{1-x}Se$, where $0 \leq x \leq 1$, and having a bandgap that is in a range of and including electron-volts; and
  a metallic electrode on a surface of the p-type semiconductor contact layer opposite the semiconductor layer.

9. The semiconductor structure of claim 8 wherein the bandgap of the p-type semiconductor contact layer is in a range of and including 0 to 0.1 electron-volts.

10. The semiconductor structure of claim 8 wherein the bandgap of the p-type semiconductor contact layer is in a range of and including 0 to 0.05 electron-volts.

11. The semiconductor structure of claim 8 wherein the p-type semiconductor contact layer is formed of $Pb_xSn_{1-x}Se$, where $0 \leq x \leq 1$, with a mole fraction of Sn in a range of and including 0.08 to 0.46.

12. The semiconductor structure of claim 8 wherein the p-type semiconductor contact layer is formed of $Pb_xSn_{1-x}Se$, where $0 \leq x \leq 1$, with a mole fraction of Sn in a range of and including 0.18 to 0.37.

13. The semiconductor structure of claim 8 wherein the p-type semiconductor contact layer is formed of $Pb_xSn_{1-x}Se$, where $0 \leq x \leq 1$, with a mole fraction of Sn in a range of and including 0.23 to 0.32.

14. A semiconductor structure comprising:
  a semiconductor layer;
  a p-type semiconductor contact layer on a surface of the semiconductor layer, the p-type semiconductor contact layer being formed of $Pb_xSn_{1-x}Te$, where $0 \leq x \leq 1$, and having a bandgap that is in a range of and including 0 0.2 electron-volts; and
  a metallic electrode on a surface of the p-type semiconductor contact layer opposite the semiconductor layer.

15. The semiconductor structure of claim 14 wherein the bandgap of the p-type semiconductor contact layer is in a range of and including 0 to 0.1 electron-volts.

16. The semiconductor structure of claim 14 wherein the bandgap of the p-type semiconductor contact layer is in a range of and including 0 to 0.05 electron-volts.

17. The semiconductor structure of claim 14 wherein the p-type semiconductor contact layer is formed of $Pb_xSn_{1-x}Te$, where $0 \leq x \leq 1$, with a mole fraction of Sn in a range of and including 0.21 to 0.95.

18. The semiconductor structure of claim 14 wherein the p-type semiconductor contact layer is formed of $Pb_xSn_{1-x}Te$, where $0 \leq x \leq 1$, with a mole fraction of Sn in a range of and including 0.4 to 0.76.

19. The semiconductor structure of claim 14 wherein the p-type semiconductor contact layer is formed of $Pb_xSn_{1-x}Te$, where $0 \leq x \leq 1$, with a mole fraction of Sn in a range of and including 0.49 to 0.67.

20. A semiconductor structure comprising:
  a semiconductor layer comprising a p-type thermoelectric material formed in a Group IIa and IV-VI materials system;
  a semiconductor contact layer on a surface of the semiconductor layer, the semiconductor contact layer being formed of a Group IIa and IV-VI material having a bandgap that is in a range of and including 0 to 0.2 electron-volts; and
  a metallic electrode on a surface of the semiconductor contact layer opposite the semiconductor layer.

21. A semiconductor structure comprising:
a semiconductor layer comprising a p-type PbSe based thermoelectric material;
a semiconductor contact layer on a surface of the semiconductor layer, the semiconductor contact layer being formed of $Pb_ySn_{1-y}Se$, where $0 \le y \le 1$, and having a bandgap that is in a range of and including 0 to 0.2 electron-volts; and
a metallic electrode on a surface of the semiconductor contact layer opposite the semiconductor layer.

22. The semiconductor structure of claim 21 wherein the p-type PbSe based thermoelectric material comprises at least one layer of PbSe and at least one layer of $Pb_xSr_{1-x}Se$, where $0 \le x \le 1$.

23. A semiconductor structure comprising:
a semiconductor layer comprises comprising a p-type PbSe based thermoelectric material;
a semiconductor contact layer on a surface of the semiconductor layer, the semiconductor contact layer being formed of $Pb_xSn_{1-x}Te$, where $0 \le x \le 1$, and having a bandgap that is in a range of and including 0 to 0.2 electron-volts; and
a metallic electrode on a surface of the semiconductor contact layer opposite the semiconductor layer.

24. The semiconductor structure of claim 23 wherein the p-type PbSe based thermoelectric material comprises at least one layer of PbSe and at least one layer of $Pb_xSr_{1-x}Se$, where $0 \le x \le 1$.

25. A method of fabricating a semiconductor structure comprising:
providing a semiconductor layer;
providing a semiconductor contact layer on a surface of the semiconductor layer, the semiconductor contact layer having a bandgap that is in a range of and including 0 to 0.1 electron-volts; and
providing a metallic electrode on a surface of the semiconductor contact layer opposite the semiconductor layer.

* * * * *

UNITED STATES PATENT AND TRADEMARK OFFICE
CERTIFICATE OF CORRECTION

| | | |
|---|---|---|
| PATENT NO. | : 8,564,129 B2 | Page 1 of 1 |
| APPLICATION NO. | : 13/565960 | |
| DATED | : October 22, 2013 | |
| INVENTOR(S) | : Robert Joseph Therrien et al. | |

It is certified that error appears in the above-identified patent and that said Letters Patent is hereby corrected as shown below:

In the Claims

In column 14, at lines 6-7, change "of and including electron-volts" to --of and including 0 to 0.2 electron-volts--.

In column 14, at lines 33-37, change "of and including 0 0.2 electron-volts" to --of and including 0 to 0.2 electron-volts--.

In column 15, at line 15, change "comprises comprising" to --comprising--.

Signed and Sealed this
Twenty-fourth Day of March, 2015

Michelle K. Lee
*Director of the United States Patent and Trademark Office*